United States Patent [19]

Halder

[11] Patent Number: 4,513,274

[45] Date of Patent: Apr. 23, 1985

[54] CURRENT TRANSFORMER FOR MEASURING INSTRUMENTS

[75] Inventor: Mathis Halder, Baar, Switzerland

[73] Assignee: LGZ Landis & Gyr Zug AG, Zug, Switzerland

[21] Appl. No.: 484,921

[22] Filed: Apr. 14, 1983

[30] Foreign Application Priority Data

Apr. 22, 1982 [CH] Switzerland .................. 2438/82

[51] Int. Cl.³ ............................................. H01F 40/00
[52] U.S. Cl. .................................. 336/173; 336/174; 336/175; 336/100; 324/127
[58] Field of Search ............... 336/174, 175, 180, 181, 336/184, 173; 323/253, 335, 357, 358; 324/117 R, 127

[56] References Cited

U.S. PATENT DOCUMENTS

| | | | |
|---|---|---|---|
| 1,882,773 | 10/1932 | Callsen | 336/174 X |
| 1,971,207 | 8/1934 | Boyajian et al. | 336/174 X |
| 2,244,386 | 6/1941 | Camilli | 336/175 X |

FOREIGN PATENT DOCUMENTS

| | | | |
|---|---|---|---|
| 129185 | 7/1932 | Austria . | |
| 798509 | 11/1968 | Canada | 336/175 |
| 708667 | 7/1941 | Fed. Rep. of Germany . | |
| 284484 | 11/1952 | Switzerland . | |

OTHER PUBLICATIONS

Strom und Spannungswandler (Current & Voltage Transducer), Oldenbourg Verlag, (Publishers), 1944, pp. 14–18.
Proc. IEE, vol. 123, No. 10R, Oct. 1975, p. 1030.

Primary Examiner—Harry E. Moose, Jr.
Assistant Examiner—Susan Steward
Attorney, Agent, or Firm—Ernest F. Marmorek

[57] ABSTRACT

The current transformer for instruments for measuring electric currents includes a magnetic core that has two cores and an inductive current divider with three parallel current paths. The current dividers form, together with cores, two current transformer stages whose magnetic fluxes mutually cancel one another. In a current transformer for AC currents having a DC component, the ratio of the ohmic resistances of the individual current paths is in direct relation to their transformation ratio.

6 Claims, 3 Drawing Figures

CURRENT TRANSFORMER FOR MEASURING INSTRUMENTS

BACKGROUND OF THE INVENTION

The present invention relates to current transformers for instruments for measuring electric currents and having magnetic cores.

Current transformers for electric current measuring instruments are known per se. Essentially, they consist of a magnetic core with a primary winding carrying the current to be measured and a secondary winding carrying the current which has been matched to the instrument. The ratio of the number of turns in the primary winding to that of the secondary winding determines the transformation ratio ü of the current transformer. A large transformation ratio ü requires a great number of turns in the secondary winding. For instance, a current transformer with a primary winding consisting of a single turn and carrying 10 A will require a secondary winding of 100 turns to produce a measuring current of 100 mA. A large number of turns usually results in an undesirably large winding capacitance which is detrimental to the precision of the current transformer. Current transformers are sensitive to DC currents. Due to the high initial permeability of the magnetic core material, even a small DC current component will generate an induction current high enough to drive the core into saturation. This gives rise to unacceptable transmission aberrations. In order to reduce sensitivity to DC, current measurement can employ ohmic current dividers in the form of shunts. However, precision measurements using the shunt method are subject to errors due to possible temperature differences between individual current paths as well as to the inductive components of the resistances.

SUMMARY OF THE INVENTION

It is therefore one of the principal objects of the present invention to substantially eliminate the aforementioned disadvantages of known devices and to create a current transformer which requires a reduced number of total winding turns and which measures the AC current component with a negligibly small measurement error despite a superimposed DC current component.

This object is achieved in a current transformer for instruments for measuring electric currents which includes a magnetic core that comprises two cores and a current divider with three parallel current paths; the current dividers form together with the cores two current transformer stages whose magnetic fluxes mutually cancel one another. In a current transformer for AC currents having a DC component, the ratio of the ohmic resistances of the current paths is in direct relation to their transformation ratio. The cores may consist of laminated, annular or ferrite cores.

Further objects and advantages of the invention will be set forth in part in the following specification, and in part will be obvious therefrom, without being specifically referred to, the same being realized and attained as pointed out in the claims thereof.

BRIEF DESCRIPTION OF THE DRAWINGS

For a further understanding of the nature and objects of the invention, reference should be had to the following detailed description, taken in connection with the accompanying drawings in which.

DESCRIPTION OF THE PREFERRED EMBODIMENTS

Figure 1:
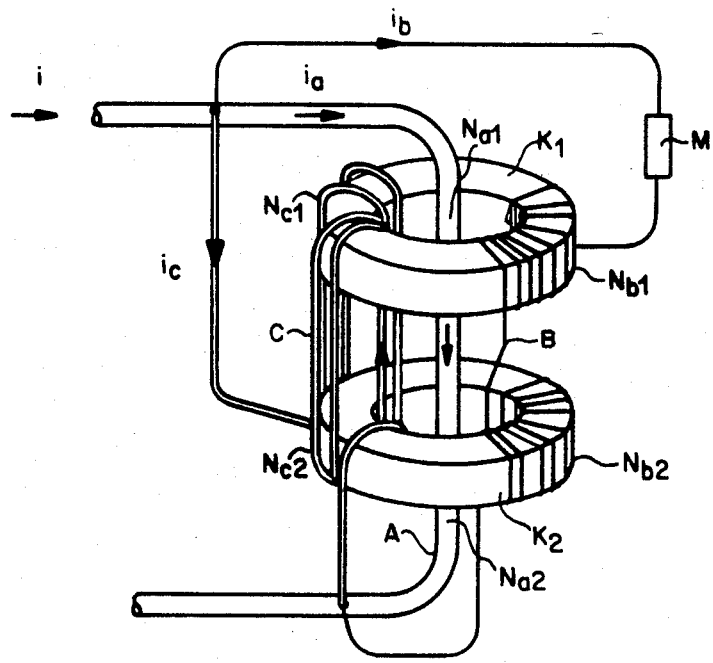
FIG. 1 is a perspective view of a current transformer in accordance with a preferred embodiment of the invention.

Referring now to the drawings, FIG. 1 schematically shows the arrangement of the current transformer according to the invention which in substance consists of a magnetic core comprising two annular cores $K_1$, $K_2$ and of three inductive current dividers connected in parallel and forming current paths A, B and C. Laminated cores or ferrite cores may be substituted for core rings $K_1$, $K_2$.

The first current path or circuit A passes through both annular cores $K_1$, $K_2$ and forms two windings $N_{a1}$, $N_{a2}$ consisting of a single turn. The second current path or circuit B comprises two windings $N_{b1}$, $N_{b2}$ having nine turns each, the first winding $N_{b1}$ being wound on the first annular core $K_1$ in reverse sense to the first winding $N_{a1}$ of the first current path A and the second winding $N_{b2}$ being wound on the second annular core $K_2$ in the same sense as the second winding $N_{a2}$ of the first current path A. The third current path C comprises two windings $N_{c1}$, $N_{c2}$ having four turns each which are wound commonly on both annular cores $K_1$, $K_2$ and wherein, whereby the second winding $N_{c2}$ has an additional turn wound on the second annular core $K_2$. It is also possible to wind the first winding $N_{c1}$ on the first core $K_1$ and the second winding $N_{c2}$ on the second core $K_2$. The windings $N_{c1}$, $N_{c2}$ of the current path C are wound in reverse sense to the windings $N_{a1}$, $N_{a2}$ of the first current path A. A tapping point M for a measuring instrument is provided in the circuit of the current path B.

Figure 2:
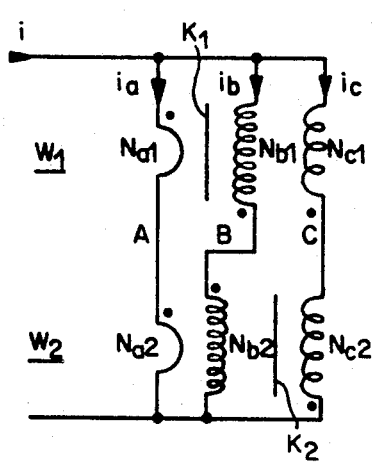
FIG. 2 is a circuit diagram of the transformer of FIG. 1.

The current i to be measured is divided according to FIG. 2 into three partial currents $i_a$, $i_b$ and $i_c$, which flow in the first, second and third current paths A, B and C respectively. The first windings $N_{a1}$, $N_{b1}$ and $N_{c1}$ of each of these current paths or circuits form, with the first annular core $K_1$, a first transformer stage $W_1$. The second windings $N_{a2}$, $N_{b2}$ and $N_{c2}$ of each of the current paths form, with the second annular core $K_2$ a second transformer stage $W_2$. The transformer stages $W_1$ and $W_2$ balance their magnetic fluxes out. The magnetic flux of the winding $N_{a1}$ cancels out that of the windings $N_{b1}$ and $N_{c1}$ because of the reversed winding sense. In similar manner, the magnetic fluxes of the windings $N_{a2}$ and $N_{b2}$ are cancelled out by that of the winding $N_{c2}$.

Consequently:

$$i_a19\, N_{a1} = i_b \cdot N_{b1} + 1_c \cdot N_{c1} \tag{1}$$

and $$i_c \cdot N_{c2} = i_a \cdot N_{a2} + i_b \cdot N_{b2} \tag{2}$$

and by employing the corresponding number of winding turns:

$$i_c = 18\, i_b \tag{3}$$

$$i_a = 81\, i_b \tag{4}$$

The transformation ratio is given by the known formula:

$$ü_b = i/i_b = (i_a + i_b + i_c)/i_b \tag{5}$$

Entering the results obtained in (3) and (4) above into equation (5) yields a value of 100 for the transformation ratio. It is therefore possible, with this current transformer, to obtain, with only 29 winding turns in all, the same transformation ratio of 100 as would be obtained in heretofore known devices with 100 secondary winding turns and one primary turn. This signficant economy of turns and consequently of magnet wire results in a reduction of winding capacitance and of manufacturing costs. The division of the current is effected solely by the turn number which determine the desired transformation.

The magnetic fluxes of both current transformer stages $W_1$ and $W_2$ due to DC current components must cancel each other out in a similar manner to that in which those due to the basic AC component do. This mutual cancellation is only attained if the ratio of the resistances of the individual current paths A, B anc C is in direct relation to the transformation ratios of said current paths A, B and C. Therefore:

$$R_a : R_b : R_c = ü_c : ü_b \tag{6}$$

Figure 3:
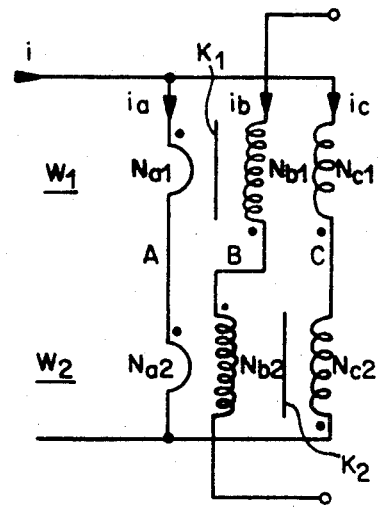
FIG. 3 is a circuit diagram similar to FIG. 2, but embodying a modification.

In the presence of AC and of DC both transformer stages $W_1$, $W_2$ operate nearly in equilibrium. The compensating current $i_b$ is therefore small if the turn numbers of the windings $N_{b1}$, $N_{b2}$ are low, so that the compensating current $i_b$ may even be galvanically isolated. A corresponding circuit diagram for both transformer stages $W_1$, $W_2$ is shown in FIG. 3 with the current path B isolated from the current paths A and C. Such a current transformer has the advantage that it is not necessary to use an interstage transformer for galvanic isolation in the current path B, which would in most cases be necessary. The total current i now consists of partial currents $i_a$ and $i_c$, so that the transformation ratio is:

$$ü_b = (i_a + i_c)/i_b \tag{7}$$

Entering the values obtained in (3) and (4) yields a value for the transformation ratio of only 99. In order to obtain a transformation ratio of 100 in this embodiment the turn numbers of windings $N_{b1}$ and $N_{b2}$ of the isolated current path B must be made 10 and 8 respectively, which can readily be calculated from formulas (1) and (2).

AC current division is determined by the turn numbers of the individual windings and is therefore subject to the influences of neither temperature nor of the winding resistances. The current division in the presence of DC current components is substantially determined by the ohmic resistances of the current paths A, B and C. The proposed connection in parallel of all three current paths, or of both current paths A and C, permits the employment of low turn numbers even with a large current subdivision, and results in correspondingly low winding capacitances.

By changing the turn numbers of the individual windings, the transformation ratio and thereby the division of the current to be measured can be varied within broad limits. The design of both transformer stages $W_1$ and $W_2$ must, however, be such that the current paths are nearly in equilibrium and the magnetic fluxes cancel each other out.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A current transformer for use in electrical AC current measuring instruments,
    comprising in combination,
    first, second and third current circuits, each circuit including a first winding, and a second winding in series with said first winding, and each winding having respective predetermined numbers of turns,
    first and second cores,
    said first windings forming with said first core a first current transformer stage,
    said second windings forming with said second core a second current transformer stage,
    at least said first and third current circuits being connected in parallel,
    said first and second windings of said first circuit being wound on said first and second cores in a predetermined sense,
    said first winding of said third current circuit being wound on one of said cores in a sense opposite to said predetermined sense,
    said second winding of said third current circuit being wound on the other core in said opposite sense,
    a samll difference existing between the number of turns of said first and second windings of said third current circuit.

2. A current transformer according to claim 1, said cores being formed from at least one of the following materials, laminated metal, and ferrite metal.

3. A current transformer according to claim 1 wherein said second current circuit is galvanically isolated from said first and third current circuits.

4. The current transformer as claimed in claim 1, wherein each winding produces a magnetic flux, and wherein the flux of one of said first windings substantially cancels the flux of the remaining of said first windings, and wherein the flux of one of said second windings substantially cancels the flux of the remaining of said second windings.

5. The current transformer as claimed in claim 1, wherein said second current circuit is connected in parallel with said first and third current circuits, and wherein each current circuit has a predetermined resistance, and wherein the AC current flowing in each corresponding circuit is inversely proportional to the resistance of said corresponding circuit.

6. The current transformer as claimed in claim 1, wherein the first winding of said second circuit is wound on said first core in said opposite sense, and wherein the second winding of said second circuit is wound on said second core in said predetermined sense, and wherein said small difference between the number of turns of said first and second windings of said third current circuit includes said second winding being wound an additional turn beyond the number of turns of said first winding of said third circuit.

* * * * *